United States Patent [19]

Ouwerkerk

[11] Patent Number: 5,461,508
[45] Date of Patent: Oct. 24, 1995

[54] DEVICE FOR DOUBLING THE FREQUENCY OF A LIGHT WAVE

[75] Inventor: Martin Ouwerkerk, Eindhoven, Netherlands

[73] Assignee: U.S. Philips Corporation, New York, N.Y.

[21] Appl. No.: 159,757

[22] Filed: Nov. 30, 1993

Related U.S. Application Data

[63] Continuation of Ser. No. 804,572, Dec. 10, 1991, abandoned.

[30] Foreign Application Priority Data

Dec. 18, 1990 [NL] Netherlands ............................ 9002791

[51] Int. Cl.⁶ .................................................. G02B 6/00
[52] U.S. Cl. ........................................... 359/328; 385/122
[58] Field of Search .................. 385/122; 359/326–332; 252/582–584

[56] References Cited

U.S. PATENT DOCUMENTS

| | | | |
|---|---|---|---|
| 3,423,686 | 1/1969 | Ballman et al. | 330/4.5 |
| 3,897,590 | 7/1975 | Gürs | 156/620.3 X |
| 4,897,562 | 1/1990 | Krasinski et al. | 359/328 X |

*Primary Examiner*—Akm E. Ullah
*Attorney, Agent, or Firm*—Michael J. Balconi-Lamica

[57] ABSTRACT

Potassium-rubidium-lithium niobate crystals having the composition $$(K_2O)_{0.3-x}(Rb_2O)_x(Li_2O)_{0.2-y}(Nb_2O_5)_{0.5+y}$$

where $0.05 \leq x \leq 0.12$ and $0 \leq y \leq 0.025$ are manufactured and used as a nonlinear optical medium in a device for doubling the frequency of a light wave, in which device a fundamental light wave is guided through the nonlinear optical medium while forming a second harmonic wave. The device brings about frequency doubling of light having wavelengths exceeding 770 nm and can be suitably used in combination with a semiconductor laser light source.

2 Claims, 1 Drawing Sheet

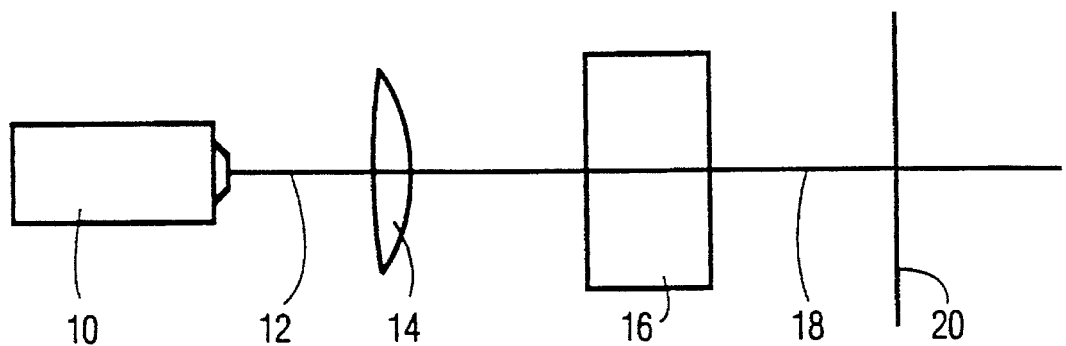

DEVICE FOR DOUBLING THE FREQUENCY OF A LIGHT WAVE

This is a continuation of application Ser. No. 07/804,572 filed Dec. 10, 1991 now abandoned.

BACKGROUND OF THE INVENTION

The invention relates to a device for doubling the frequency of a light wave, in which device a fundamental light wave is guided through a nonlinear optical medium while forming a second harmonic wave.

The invention also relates to potassium-rubidium-lithium niobate crystals and to a method of manufacturing such crystals.

The device according to the invention may be used, for example, in combination with a semiconductor laser light source which generates red light, as a compact blue light source for optical storage of information, for telecommunication and for laser printers. By virtue of the use of short-wave light, the information density can be increased and the possibilities of writing and erasing information are extended as a result of the greater photon energy.

In European Patent Application EP 90201923.1, a device for doubling the frequency of a light wave is described, a fundamental light wave being generated by a semiconductor laser light source and guided through a nonlinear optical medium while forming a second harmonic wave, said nonlinear optical medium being formed from a stoichiometric potassium-lithium niobate crystal. In such a device, frequency doubling at room temperature is optimal at a wavelength of the fundamental light wave of 803 nm. In experiments leading to the invention, it was established that, using the known device, the shortest wavelength which can be attained by frequency doubling is approximately 396 nm.

SUMMARY OF THE INVENTION

It is an object of the invention to provide, inter alia, a device by means of which frequency doubling at even shorter wavelengths can be attained. The invention aims at achieving this purpose while preserving or improving the other optical properties. For example, a high degree of double refraction is useful when direct phase matching is applied. This is important to preclude extinction of the light by phase matching the red (fundamental light wave) and blue (second harmonic light wave) light as a function of the ordinary and extraordinary refractive indices. Further, it is desirable to improve the efficiency of frequency doubling, which is reflected in a large nonlinear coefficient $d_{31}$ in the second-order susceptibility tensor. A further object of the invention is to provide crystals which can be suitably used as a nonlinear optical medium in the device according to the invention, and to provide a method of manufacturing such crystals. Said crystals should be homogeneous and, preferably, large in size and they must be resistant to high energy densities.

These objects are achieved by a device as described in the opening paragraph, in which device, according to the invention, the nonlinear optical medium is formed from a potassium-rubidium-lithium niobate crystal of the composition

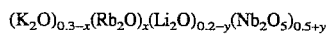

$(K_2O)_{0.3-x}(Rb_2O)_x(Li_2O)_{0.2-y}(Nb_2O_5)_{0.5+y}$ where $0.05<x<0.12$ and $0<y<0.025$.

Crystals which are particularly suitable for use in a preferred embodiment of the invention are obtained when x has a value of $0.067\pm0.003$ and y is equal to 0, said values enabling frequency doubling at very short wavelengths up to 385 nm.

According to the invention, the object of providing a method of manufacturing such crystals is achieved in that the crystals are manufactured by cooling a melt having the following molar composition on the basis of the oxides: 20 mol % of $K_2O$, 10 mol % of $Rb_2O$, 27 mol % of $Li_2O$ and 43 mol % of $Nb_2O_5$.

In a publication by Ch'ang Wang-Tiau et. al. in Bulletin of the Academy of Sciences of the USSR (Physical Series), 35 (9), pages 1661–1664 (1971) a description is given of ferroelectric materials having nonlinear optical properties, including potassium-rubidium-lithium niobate and potassium-rubidium niobate, which materials can be represented by the above compositional formula wherein x has values of 0.20 and 0.30, respectively, and y is equal to 0. Said materials are manufactured according to ceramic methods by sintering and they do not have the desired crystal structure. Potassium-lithium niobate as described in the above-mentioned European Patent Application EP 90201923.1 can be represented in the above-mentioned compositional formula with values of x=0 and y=0.

The crystals according to the invention are suitable for use in electro-optical modulators. For use in a laser resonant cavity for Q-switching (for example in a Pockels cell), the possibility to use of a low control voltage enabling high switching speeds is advantageous.

BRIEF DESCRIPTION OF THE DRAWING

The invention will be explained in greater detail by means of exemplary embodiments and with reference to the accompanying drawing, in which the sole FIGURE diagrammatically shows a device according to the invention, which device can be suitably used to generate blue laser light.

DETAILED DESCRIPTION OF THE PREFERRED EMBODIMENT

Exemplary embodiment 1

Niobium pentoxide $Nb_2O_5$ in a quantity of 857.80 g, 207.42 g of potassium carbonate $K_2CO_3$, 173.32 g of rubidium carbonate $Rb_2CO_3$ and 149.73 g of lithium carbonate $Li_2CO_3$ were mixed, melted by heating to 1050° C. and stabilized at said temperature for 3 hours. The molar composition of the melt on the basis of the oxides was as follows: 43 mol % of $Nb_2O_5$, 20 mol % of $K_2O$, 10 mol % of $Rb_2O$ and 27 mol % of $Li_2O$. The melt was manufactured in a Pt/Au crucible having a volume of 750 mi.

The melt was cooled at a rate of 10° C./hr to 1000° C., at a rate of 0.5° C./hr to 940° C. and at a rate of 10° C./hr to room temperature. The furnace used has a very stable temperature with a variation of less than 0.3° C. for 60 hours.

A crystal was formed at a wire end of Pt/Au, approximately 5 to 10 vol % of the melt being convened into a potassium-rubidium-lithium niobate crystal. The crystals exhibit a tetragonal $P_{4bm}$ structure and have an a-axis with a length of 1.25636 nm and a c-axis with a length of 0.40672 nm. The crystals have the following composition

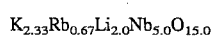

$K_{2.33}Rb_{0.67}Li_{2.0}Nb_{5.0}O_{15.0}$ which corresponds to x=0.067 and y=0 in the above-indicated general formula. The composition of the crystals is very homogeneous with a variation of less than 1:5000.

The crystals are transparent and exhibit no absorption at wavelengths in the visible light range. The resistance to high energy densities was tested by means of a focused 13 W Ar-ion laser at a wavelength of 488 nm. At radiation loads up to 100 MW/cm$^2$ no damage occurred.

Exemplary embodiment 2

A melt having the same composition as in exemplary embodiment 1 was manufactured at a temperature of 1075° C. and stabilized at said temperature for 3 hours. The melt was cooled at a rate of 100° C./hr to 1000° C., at a rate of 10° C./hr to 950° C. and at a rate of 50° C./hr to room temperature. This method has the advantage that it is much quicker than the method according to exemplary embodiment 1 and that less $CO_2$ is absorbed in the melt. By virtue thereof, larger crystals having fewer cracks can be manufactured. The composition of the crystals differs little from the composition used to manufacture the crystals according to exemplary embodiment 1.

Exemplary embodiment 3

A crystal manufactured according to exemplary embodiment 1 was ground thin (thickness 0.27 ram) with parallel, polished input and output planes for the light beam. Said input and output planes extended parallel to the c-axis of the crystal lattice. The FIGURE shows a laser light source 10, for example a semiconductor laser light source such as a GaAs laser or a AlGaAs laser, by means of which a fundamental light wave 12 having a maximum intensity of 100 mW is generated. By means of a lens 14, the light wave was focused on a window on the thin-ground potassium-rubidium-lithium niobate crystal 16. The sectional area of the light beam at the location of the crystal was 1.22×10$^{-5}$ cm$^2$, the angular aperture of the light beam was less than 2°. The light wave 12 was polarized in a direction parallel to the c-axis of the crystal by means of a polarization filter which is not shown in the FIGURE. The outgoing light ray 18 contains a quantity of light, for example blue light, the frequency of which has doubled relative to the ingoing light ray. Said generated second harmonic wave extends parallel to the fundamental light wave and is polarized in a direction perpendicular to the c-axis of the crystal structure. The intensity of the second harmonic wave is proportional to the square of the intensity of the fundamental light wave. If desired, the red light can be obstructed at the location of the outgoing light my by means of a colour filter 20.

Phase matching and, by virtue thereof, an optimum yield of the second harmonic light wave obtained was attained at a wavelength of 775.6 nm at 20° C. The generated blue light wave had a wavelength of 387.8 nm. The wavelength at which phase matching takes place depends on the temperature, the temperature dependence being 0.292 nm/° C. This perfectly matches the temperature dependence of approximately 0.3 nm/° C. of the wavelength of the light generated by the multimode GaAs and AlGaAs semiconductor lasers. The standardized phase matching line width is 0.068±0.006 nm.cm. This value indicates the permissible wavelength deviation at which phase matching and, hence, effective frequency doubling is still possible. In the case of potassium-lithium niobate according to the state of the art, this value is 0.084 nm.cm. This means that for both materials the wavelength has to remain within narrow limits, however, the range is not so small that the material becomes useless in practice.

The homogeneity of the potassium-rubidium-lithium niobate crystal was such that, throughout the crystal, the optimum wavelength for phase matching varied less than 1 to 2 nm. The method adopted had such a great reproducibility that the reproducibility of the optimum wavelength for phase matching was better than 3 nm.

The nonlinear coefficient $d_{31}$ in the second-order susceptibility tensor is 14±1 pm/V. In the case of potassium-lithium niobate, this value is 13 pro/V, which shows that the frequency-doubling efficiency is higher in the material according to the invention.

The ordinary refractive index $n_o$ of the potassium-rubidium-lithium niobate crystals is 2.2792±0.0005, the extraordinary refractive index $n_e$ is 2.1145±0.0005, at 20° C. and 632.8 nm. This results in a double refraction value of 0.165±0.001. For comparison: in the case of potassium-lithium niobate the double refraction is 0.14. The temperature dependence of $n_o$ is $-1.6 \times 10^5$ K$^{-1}$, the temperature dependence of $n_e$ is $+6.5 \times 10^{-5}$ K$^{at}$ at 20° C.

The wavelength $\lambda_{PM}$ at which optimum phase matching takes place depends on the composition of the potassium-rubidium-lithium niobate crystal. The best result with the shortest wavelength is obtained when the composition is stoichiometric (y=0). For the values x=0.067 and y=0, it holds that $\lambda_{PM}$=775.6 nm at 20° C. For larger values of y, up to approximately 0.025, $\lambda_{PM}$ increases to approximately 860 nm. For the manufacture of crystals in which y=0.025, the method according to the preceding exemplary embodiment was used, with this difference that the lithium oxide content in the melt was reduced to 25.5 mol % and the niobium oxide content was increased correspondingly. For values of x<0.05, it holds that, relative to potassium-lithium niobate (x=0), the properties obtained have improved to an insufficient degree. For values of x>0.12, inhomogeneous, two-phase crystals are obtained.

When larger crystals having a thickness in excess of 1 mm are used, it is efficacious to pole the crystals, before they are used, in an electric field having a strength of 220 V/cm at a temperature of 495 ° C. to counteract any negative consequences of the greater inhomogeneity of such larger crystals.

Exemplary embodiment 4

Small potassium-rubidium-lithium niobate crystals were manufactured, using a ceramic method, by sintering the powdered starting materials according to exemplary embodiment 1, for 24 hours at 950° C.

In the case of crystals having the same composition as in the above-mentioned formula, where x=0.12 and y=0, it was established that $\lambda_{PM}$=770 nm and that $d_{31}$=16.9±1 pm/V. For x=0.12 and y=0.025, it was measured that $\lambda_{PM}$=900 nm and $d_{31}$ =12.5±1 pm/V. For comparison: in potassium-lithium niobate (x=0), y must be smaller than 0.015 to permit frequency doubling at wavelengths shorter than 900 nm.

I claim:

1. A device for doubling the frequency of a light wave, in which device a fundamental light wave is guided through a nonlinear optical medium while forming a second harmonic wave, characterized in that the nonlinear optical medium is formed from a potassium-rubidium-lithium niobate crystal having the composition $$(K_2O)_{0.3-x}(Rb_2O)_x(Li_2O)_{0.2-y}(Nb_2O_5)_{0.5+y}$$

where $x=0.067\pm0.003$ and $y=0$.

2. Potassium-rubidium-lithium niobate crystals, characterized in that the composition can be represented by the formula $$(K_2O)_{0.3-x}(Rb_2O)_x(Li_2O)_{0.2-y}(Nb_2O_5)_{0.5+y}$$

where $x=0.067\pm0.003$ and $y=0$.

* * * * *